United States Patent
Li et al.

(10) Patent No.: US 10,146,124 B2
(45) Date of Patent: Dec. 4, 2018

(54) FULL CHIP LITHOGRAPHIC MASK GENERATION

(71) Applicant: Xtal, Inc., San Jose, CA (US)

(72) Inventors: Jiangwei Li, San Jose, CA (US); Jihui Huang, San Jose, CA (US); Ke Zhao, San Jose, CA (US)

(73) Assignee: Xtal, Inc., San Jose, CA (US)

( * ) Notice: Subject to any disclaimer, the term of this patent is extended or adjusted under 35 U.S.C. 154(b) by 0 days.

(21) Appl. No.: 15/441,003

(22) Filed: Feb. 23, 2017

(65) Prior Publication Data

US 2017/0242333 A1 Aug. 24, 2017

Related U.S. Application Data

(60) Provisional application No. 62/298,823, filed on Feb. 23, 2016.

(51) Int. Cl.
*G03F 1/36* (2012.01)
*G06F 17/50* (2006.01)

(52) U.S. Cl.
CPC ............ *G03F 1/36* (2013.01); *G06F 17/5072* (2013.01); *G06F 17/5081* (2013.01)

(58) Field of Classification Search
CPC .... G03F 1/36; G06F 17/5081; G06F 17/5072; G06T 1/20; G06T 7/0006; G06T 2207/30148
See application file for complete search history.

(56) References Cited

U.S. PATENT DOCUMENTS

| | | | | |
|---|---|---|---|---|
| 7,552,416 B2 * | 6/2009 | Granik | ...................... | G03F 1/36 716/50 |
| 7,716,627 B1 * | 5/2010 | Ungar | ...................... | G06F 17/50 716/54 |
| 7,954,071 B2 * | 5/2011 | Barnes | ...................... | G03F 1/36 382/144 |
| 8,082,525 B2 * | 12/2011 | Liu | .......................... | G03F 1/36 378/35 |

(Continued)

OTHER PUBLICATIONS

Pang et al.; "Source Mask Optimization (SMO) at Full Chip Scale using Inverse Lithography Technology (ILT) based on Level Set Methods"; Proc. of SPIE; vol. 7520, 75200X; 2009; pp. 1-17.*

*Primary Examiner* — Naum B Levin
(74) *Attorney, Agent, or Firm* — Young Basile Hanlon & MacFarlane, P.C.

(57) ABSTRACT

A method, an apparatus, and a non-transitory computer readable medium for full chip mask pattern generation include: generating, by a processor, an initial mask image from target polygons, performing, by the processor, a global image based full chip optimization of the initial mask image to generate new mask pattern polygons, wherein the global image based full chip optimization co-optimizes main feature polygons and SRAF image pixels, determining performance index information based on the global image based full chip optimization, wherein the performance index information comprises data for assisting a global polygon optimization, generating a mask based on the global polygon optimization of the new mask pattern polygons using the performance index information, and generating optimized mask patterns based on a localized polygon optimization of the mask.

20 Claims, 7 Drawing Sheets

(56) References Cited

U.S. PATENT DOCUMENTS

| | | | | |
|---|---|---|---|---|
| 8,103,979 B2* | 1/2012 | Zou | ............................ | G03F 1/36 |
| | | | | 716/50 |
| 8,266,556 B2* | 9/2012 | Liu | ............................ | G03F 1/68 |
| | | | | 430/30 |
| 8,479,125 B2* | 7/2013 | Pierrat | ........................ | G03F 1/36 |
| | | | | 716/50 |
| 8,490,034 B1* | 7/2013 | Torunoglu | ............ | G06F 17/5068 |
| | | | | 716/53 |
| 8,584,056 B2* | 11/2013 | Chen | ........................ | G03F 1/144 |
| | | | | 716/53 |
| 8,826,196 B2* | 9/2014 | Sahouria | .............. | G06F 17/5081 |
| | | | | 716/55 |
| 9,170,481 B2* | 10/2015 | Rieger | ........................ | G03F 1/36 |
| 9,310,674 B2* | 4/2016 | Azpiroz | ...................... | G03F 1/76 |
| 9,547,892 B2* | 1/2017 | Shi | ............................ | G06T 7/001 |
| 2014/0282290 A1* | 9/2014 | Rieger | ........................ | G03F 1/36 |
| | | | | 716/51 |
| 2015/0234269 A1* | 8/2015 | Azpiroz | ...................... | G03F 1/76 |
| | | | | 430/5 |
| 2015/0339802 A1* | 11/2015 | Isoyan | ........................ | G03F 1/36 |
| | | | | 382/128 |
| 2017/0147734 A1* | 5/2017 | Rosenbluth | ........... | G06F 17/5072 |

* cited by examiner

FULL CHIP LITHOGRAPHIC MASK GENERATION

CROSS-REFERENCE TO RELATED APPLICATIONS

This application claims priority of U.S. Provisional Application Ser. No. 62/298,823 filed on Feb. 23, 2016, the content of which is herein incorporated by reference in its entirety.

TECHNICAL FIELD

The present disclosure relates in general to integrated circuit (IC) lithographic mask generation and, in particular, to full chip lithographic mask generation using inverse lithography technology (ITL).

BACKGROUND

Manufacturers of integrated circuits ("ICs") continually strive for smaller elements for a higher density, full IC design on a wafer. For example, demands for elements whose feature sizes are less than 20 nm now exist. Optical and process corrected mask patterns are often required to meet these demands for features with finer resolution. To achieve the required resolution, the generation of the mask patterns can include optimizations to overcome inherent limitations, such as optical diffraction errors and edge placement errors ("EPE"), which occur during the lithographic pattern transfer process. The optimization can uses computational lithography modeling and optical proximity correction (OPC) techniques.

SUMMARY

One implementation of the disclosure is a method for full chip lithographic mask generation. The method can include generating, by a processor, an initial mask image from target polygons; performing, by the processor, a global full chip optimization of the initial mask image to generate new mask pattern polygons, wherein hybrid optimization co-optimizes segments of main feature polygons and SRAF image pixels of the initial mask image; determining performance index information based on the global full chip optimization, wherein the performance index information comprises data for assisting a global polygon optimization; generating a mask based on the global polygon optimization of the new mask patterns using the performance index information; and generating an optimized mask pattern based on a localized polygon optimization of the mask. The method can use a rule-based method and a model-based method for optimizations, including but not limited to, polygon region identification, dissection setting, symmetry and boundary handlings, correction optimization, and constraint management. The rule-based method is faster and more controllable by a user, and the model-based method is more automatic. The optimizations can perform seamlessly on the same software platform with user controllable performance index information and constraints. Intermediate optimization results can be used to improve accuracy, flexibility, and runtime. User configurable staged GPU can be used for acceleration of the optimization.

Another implementation of the disclosure is an apparatus for full chip lithographic mask generation. The apparatus can include a memory and a processor configured to generate initial mask image from target polygons; perform a global full chip optimization of the initial mask image to generate new mask pattern polygons, wherein the global full chip optimization co-optimizes main feature polygons and SRAF image pixels of the initial mask image; determine performance index information based on the global image based full chip optimization, wherein the performance index information comprises data for assisting a global polygon optimization; generate a mask based on the global polygon optimization of the new mask pattern polygons using the performance index information; and generate an optimized mask based on a localized polygon optimization of the mask.

Another implementation of the disclosure is non-transitory computer readable medium having executable instructions for causing a processor to identify target polygons of an initial target image; perform a global image based full chip optimization to generate new mask pattern polygons, wherein the global image based full chip optimization co-optimizes main feature polygons and SRAF image pixels of the initial mask image; determine performance index information based on the global image based full chip optimization, wherein the performance index information comprises data for assisting a global polygon optimization; generate a mask based on the global polygon optimization of the new mask pattern polygons using the performance index information; and generate an optimized mask based on a localized polygon optimization of the mask.

BRIEF DESCRIPTION OF THE DRAWINGS

The description herein makes reference to the accompanying drawings wherein like reference numerals refer to like parts throughout the several views.

DETAILED DESCRIPTION

Inverse lithography technology (ILT) is a process window based optimization that can be useful for improving resist image fidelity on wafer. ILT can be used to determine, for example, optimized mask image that produces designed wafer target patterns within allowed tolerance, which can be based on known functional transformation modeling of a photolithography process. For example, the functional transformation can be used for modeling electromagnetic, optical, chemical, or lithographic transfer effects. Because the forward transfer is many-to-one (e.g., many different mask images can produce the same wafer patterns), the ILT can be considered an optimization technique.

For full IC layout, ILT has been limited to use in designing small devices, such as memory chips, due to long computer run time for handling numerous design parameters and the complexity of the ILT process. In some aspects of the present disclosure, an ILT process can use as input a design target and perform a global image based optimization for generating a full chip optimized mask image for an entire wafer of IC devices. A model based optical proximity correction (OPC) process can be used in conjunction with the ILT process to make local adjustments on new mask patterns generated by the ILT optimization. An edge based OPC process can convert a grayscale optimized image received from the ILT process to a mask pattern of polygons. According to implementations of this disclosure, a first OPC process can be used to perform a global polygon optimization to generate subresolution assist features (SRAFs) and main patterns on mask while applying cost function analysis. A second OPC process can optimize the new mask polygons, which are generated by the first OPC process, locally to further reduce edge placement errors.

Figure 1:
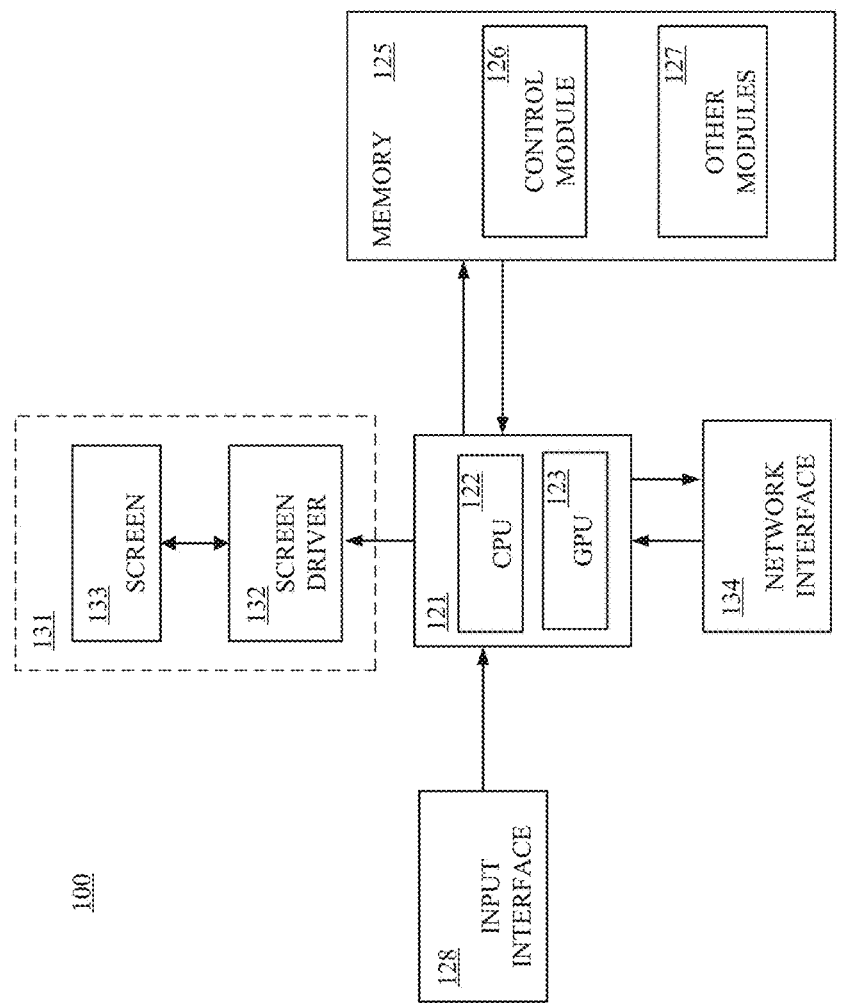
FIG. 1 is a block diagram of a computing device for mask pattern generation in accordance with the present disclosure.

FIG. 1 is a block diagram of an example computing device 100 for performing full chip mask pattern generation in accordance with this disclosure. Computing device 100 can include a microcontroller 121, memory 125 (e.g., RAM or flash memory), an input interface 128, a network interface 134, and optionally a display 131.

Microcontroller 121 can include a central processing unit (CPU) 122 and a graphical processing unit (GPU) 123. As GPUs are optimized for graphics processing, the GPU 123 can provide additional capability for the intensive ILT and OPC processes such that accuracy and speed requirements for a process window driven full chip mask generation are met. CPU 122 and GPU 123 can be implemented on the same IC or in separate ICs. CPU 122, GPU 123 or both can access and manipulate data in memory 125. In some implementations, the CPU 122 and/or the GPU 123 are not limited to a single or local device, and can be interconnetably distributed over multiple machines or geographical locations.

Memory 125 can store various modules including control module 126 or other modules 127. Memory 125 is shown coupled to microcontroller 121 which can execute the various modules. When the control module 126 and other modules 127 are executed, a set of algorithms, processes, or steps can be run for realizing the functions of global image based optimization, global edge based optimization and local edge based optimization of the mask generation in accordance with this disclosure. Memory 125 can be implemented as Random Access Memory (RAM), or any suitable non-permanent storage device that is used as memory. Memory 125 can include executable instructions and data for immediate access by CPU 122, GPU 123 or both. Memory 125 can include one or more DRAM modules such as DDR SDRAM. Alternatively, memory 125 can include another type of device, or multiple devices, capable of storing data for processing by CPU 122/GPU 123. The CPU 122/GPU 123 can utilize a cache as a form of localized fast memory for operating on data and instructions.

Network interface 134 can be used for communication with other computing devices for remote control of computing device 100 or the other computing devices in the network via a designated medium, such as a data bus or Ethernet link.

Input interface 128 can be an interface, such as a keyboard or touch screen, which enables a user to enter commands or provide parameters to the computing device 100 related to the mask pattern generation in accordance with this disclosure. Parameters or other control instructions can be loaded into memory 125 and stored in the control module 126. Input interface 128 can receive test signals, such as scanning signals at preset resolutions. In response, microcontroller 121 can perform processing and analysis of the test signals. Based on the results, microcontroller 121 can execute instructions in control module 126 to control which station is called upon to carry out a next inspection task.

Display 131 can include a screen driver 132 and a display screen 133 used for displaying various stages of the mask pattern generation, allowing a user to view the progress and make modifications via input interface 128. Screen driver 132 is coupled to microcontroller 121 and can receive instructions therefrom to drive display screen 133. In an implementation, display screen 133 can display a generated mask image prior to an optimization process, during interim stages of an optimization process, after an optimization process, or a combination thereof. Display screen 133 enables a user, such as a micropchip fabrication manager, to assess current status of the mask generation process.

The computing device 100 is an example, and a computing device can have an additional number of microcontrollers, CPUs, GPUs, or memories for performing the mask pattern generation of this disclosure. Other implementations of the computing device 100 are also possible. For example, one or more additional computing devices can operate as a network. Some or all of the techniques described herein can operate on such a network.

Figure 2:
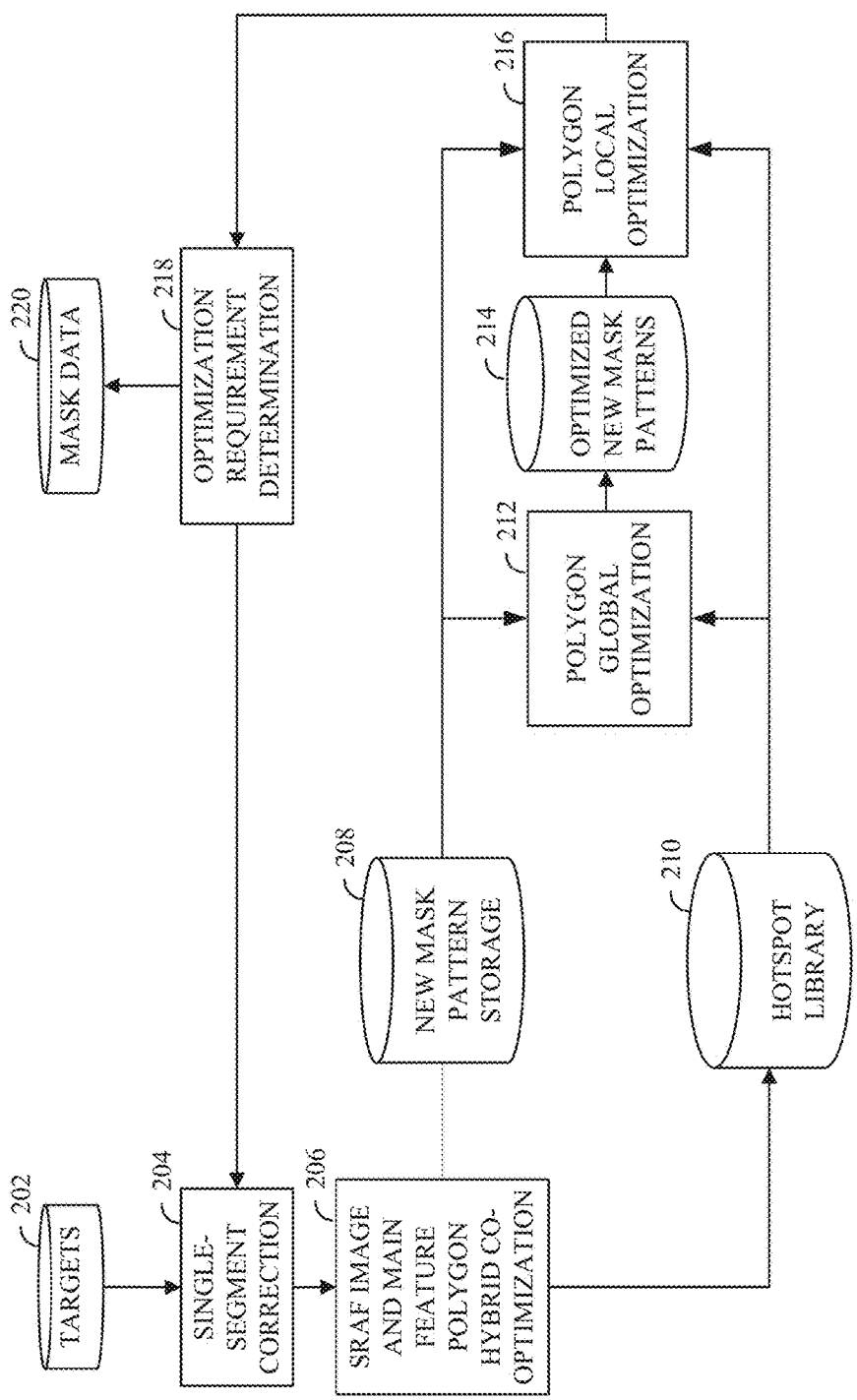
FIG. 2 is example block diagram of full chip mask pattern generation in accordance with implementations of the present disclosure.
Figure 3:
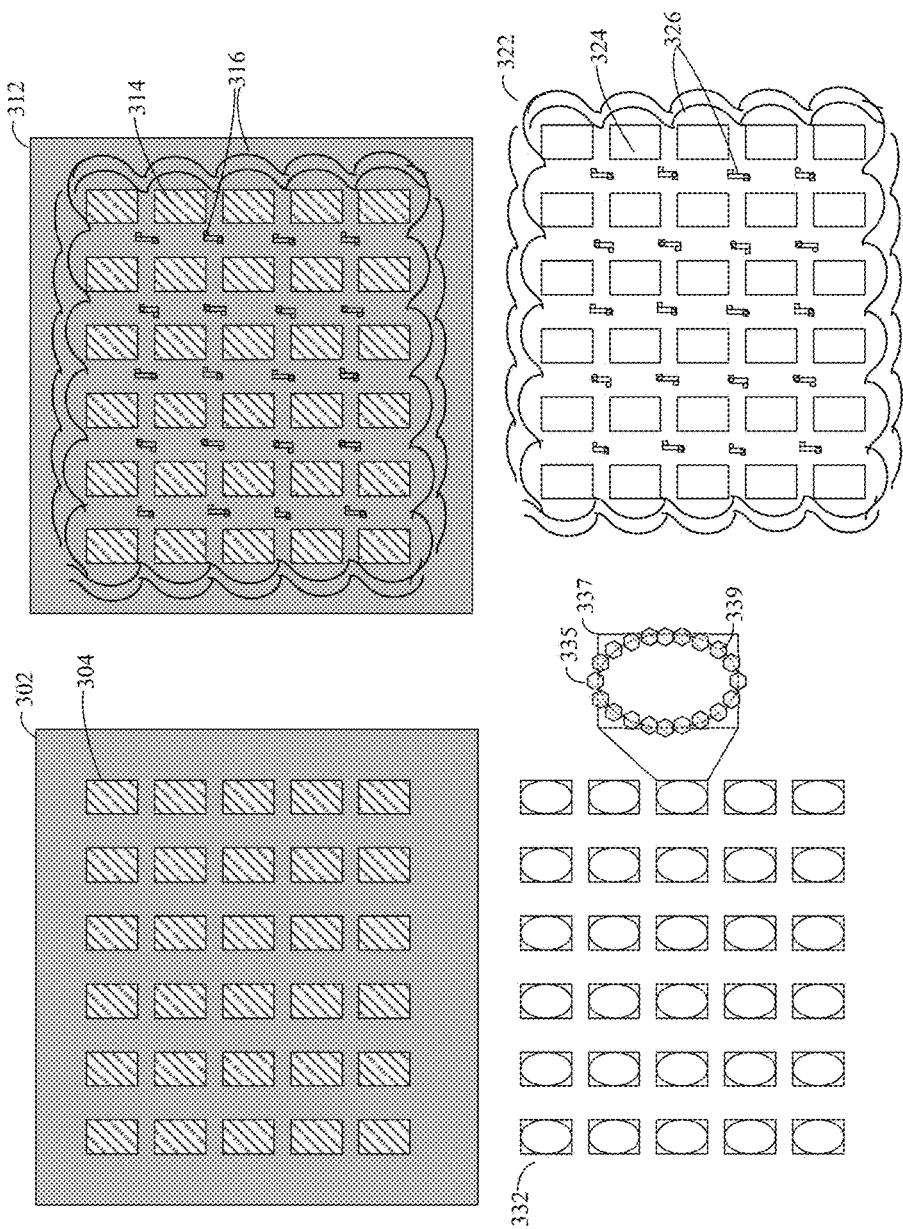
FIG. 3 is a diagram of example mask image and mask pattern transfer for the mask pattern generation in accordance with implementations of the present disclosure.

FIG. 2 shows is an example block diagram of full chip mask pattern generation in accordance with the present disclosure. Targets (e.g., target polygons) 202 can be provided in the form of an IC design layout for one or more semiconductor devices to be fabricated on a wafer. Target polygons 202 can include complex and intricate elements having linear pathways and multilayer connection points to be formed of various conductive, non-conductive and semi-conductive materials. Individual elements and gaps between elements can be 32 nm or less in size. FIG. 3 is a block diagram of mask image and mask pattern transfer for the mask pattern generation in accordance with the present disclosure. An example of the target polygons 202 is shown in FIG. 3 as target polygons 302 for a full IC. The following discussions will refer to FIG. 2 and FIG. 3 to describe the operation performed and its effect on the lithographic mask.

Referring to FIG. 2, a single-segment correction module 204 can perform single-segment (e.g., single-edge) correction on the identified target polygons. The results of the single-segment correction can be used to set bounds of optimization. For example, the single-segment correction can be a candidate solution to update the segment (e.g., edges) placement based on EPE.

An SRAF image and main feature polygon hybrid co-optimization module 206 can perform a co-optimization based on SRAF image pixels of the mask image and main feature polygon segments to produce a co-optimized mask image (e.g., a gray scale image). In some techniques for generating a final mask image, a mask image optimization stage, an SRAF extraction stage, and an OPC stage are typically decoupled. In such techniques, main feature pixels of the mask image can be unconstrained and expose high degrees of freedom to an optimizer. In addition, in some cases, due to limited memory in a computer, the mask image of a full chip can be partitioned into tiles, and SRAF image pixels across a computational tile boundary can be discrepant. If optimization environment is very different, the discrepant cross-boundary SRAF image pixels can result in large EPE and/or process variation band ("PV-Band") in the final mask image.

To remedy the aforementioned issues, the SRAF image and main feature polygon hybrid co-optimization module 206 can perform a hybrid polygon-image based co-optimization based on the SRAF image pixels and the main feature polygon segments. By performing the co-optimization, segments of main feature polygons and image pixels in SRAF regions ("SRAF image pixels") of the mask image can be co-optimized at an early stage. In some implementations, after a few iterations of the co-optimization, when an SRAF signal emerges, SRAF extraction can be performed and SRAF image pixels can be replaced by SRAF segments as optimization variables. In some implementations, for SRAF image pixels near the tile boundaries, constraints on the SRAF image pixels can also be imposed according to a shape of a target polygon. In the hybrid polygon-image based co-optimization, the main feature pixels with high degrees of freedom are not used as optimization variables, and SRAF image pixels can be optimized to conform to the shapes of the target polygons, which can generate more physically correct signals. In some implementations, the full chip mask generation/optimization can include a single-segment correction loop, the correction results of which can be used to setup the bound of the optimization. The hybrid polygon-image based co-optimization will be detailed in the following description.

An example of such a co-optimized mask image is shown in FIG. 3, where a mask image 312 includes new mask patterns depicted as main polygons 314 and SRAFs 316 (also referred to as SRAF polygons). For example, ILT can be used to determine the co-optimized main features and SRAFs. The process window, which can be enhanced by the SRAFs, can include a set of process parameters to allow a certain variation in designed specifications of the manufactured IC. In an implementation, for example, the SRAF image and main feature polygon hybrid co-optimization module 206 can apply ILT functions to extract the main polygons 314 and SRAFs 316, which can be stored in new mask pattern storage 208. As the ILT functions can be performed using GPUs or a combination of CPUs and GPUs, excessive computer run time can be avoided. The SRAF image and main feature polygon hybrid co-optimization module 206 can generate performance index information to be stored in hotspot library 210, which can be in the form of a database. The hotspot library 210 can store information related to potential problem regions, elements, or gaps that can be used for further adjustment or error correction for the optimized mask. For example, the hotspot library 210 can contain information or parameters for one or more of the following: edge placement error ("EPE"), process window metrics, mask error enhancement factor ("MEEF"), and image log slope ("ILS") values. For example, the EPE can be determined as a difference between intended and printed features in an IC layout. The MEEF can be determined as a ratio of a change in a mask feature size over the corresponding change in a resist image feature size. The ILS values can be determined as the slope of logarithm of image intensity, which can be used to determine image quality.

Polygon global optimization module 212 and polygon local optimization module 216 can receive the new mask patterns from new mask pattern storage 208 and hotspot library 210 information and parameters for performing edge based optimization on the main and SRAF polygons. Run time savings can be achieved by the implementations of the indexed hotspot library 210 information and parameters which assist the edge based optimization.

In some implementations, polygon global optimization module 212 iteratively generates optimized new mask patterns 214 according to forward propagation and backward propagation cost analyses, as will be described below in FIGS. 4 and 5. An example of the optimized new mask patterns 214 is shown in FIG. 3, in which a mask 322 includes optimized new mask patterns, which include binary main polygons 324 and binary SRAF polygons 326. One or more of the polygon global optimization module 212 and polygon local optimization module 216 can utilize OPC algorithms with process conditions for improved process window performance, thus benefiting from the optimized new mask patterns 214 generated by the SRAF image and main feature polygon hybrid co-optimization module 206.

Polygon local optimization module 216 can receive the optimized new mask patterns generated by polygon global optimization module 212, and can perform edge based optimization locally on at least one segment of the optimized polygons to generate optimized mask patterns, while using performance index information from hotspot library 210. Hotspot library 210 is a listing of potential defects in the fabrication process. For example, polygon local optimization module 216 can receive an optimized mask image 332 as shown in FIG. 3, which is shown overlapping the initial target polygons 337. Polygon local optimization module 216 can perform error checks 335 along the contour 339 of the optimized polygon and determine whether a correction should be performed.

Referring back to FIG. 2, an optimization requirement determination module 218 can determine whether the optimized mask patterns meets an optimization requirement. If the optimization requirement are not met, the optimized mask patterns can be sent to the single-segment correction module 204 to repeat the processes performed by modules 206-216 until the optimization requirement are met. If the optimization requirement are met, optimized mask data 220 can be stored as a final mask data (e.g., mask patterns). For example, the final mask data can be produced by the three stage optimization described below, including hybrid polygon-image based global optimization, polygon global optimization, and polygon local optimization.

In some implementations, the hotspot library 210 can include information and parameters as collective values for the mask, such as a cost function value. For example, the cost can be determined for edge based optimization operations, which will be described below in greater detail in FIG. 5.

Figure 4:
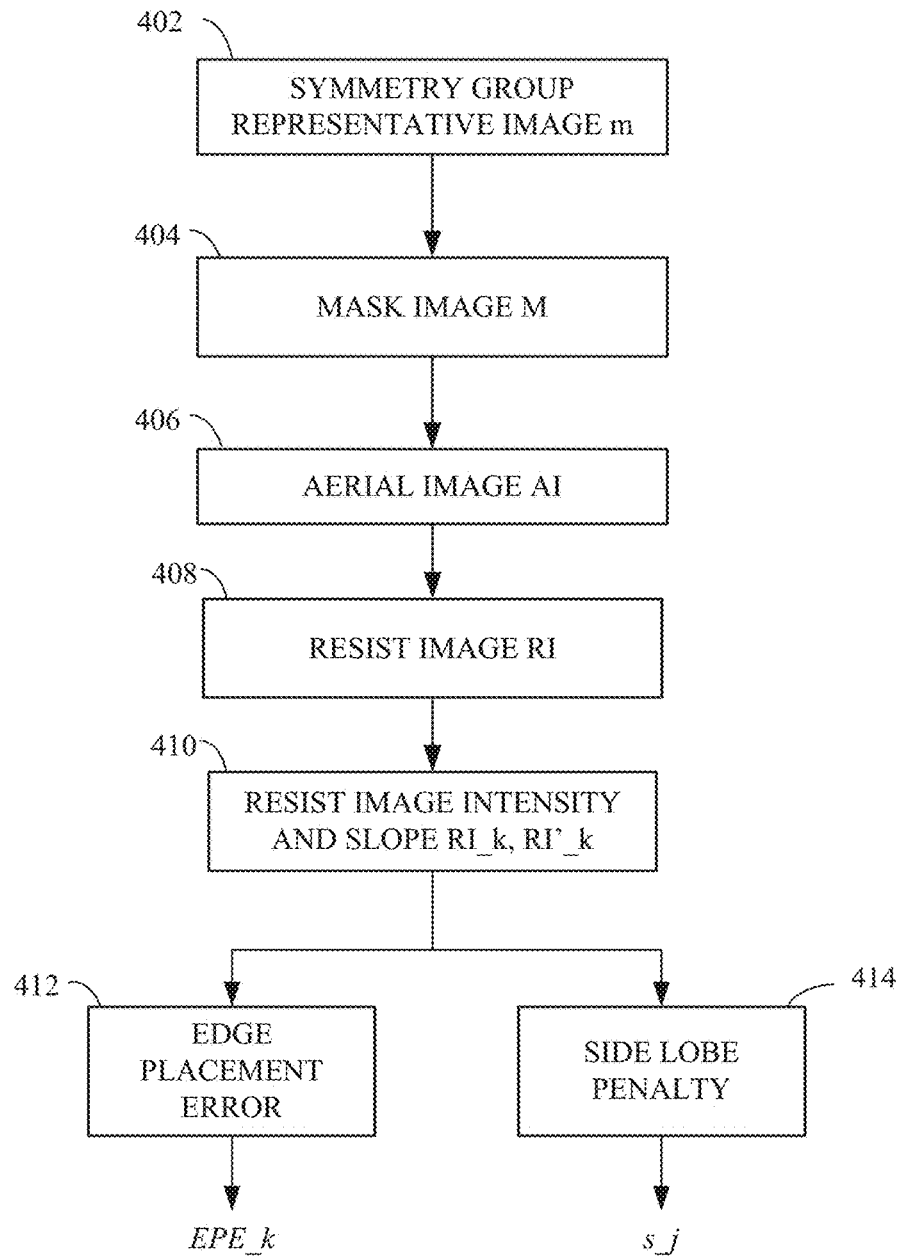
FIG. 4 is a diagram of an example process of forward propagation for edge based optimization in accordance with implementations of the present disclosure.

FIG. 4 is a diagram of an example process 400 of numerical models that describes the forward propagation from a mask image to a resist image in accordance with the present disclosure. In some implementations, the process 400 can use an iterative optimization technique such as a Broyden-Fletcher-Goldfarb-Shanno (BFGS) technique or a Gauss-Newton method for non-linear least square problems. The process 400 includes a series of modules. In an implementation, a module of the series of the modules can model an operation (e.g., a step) in a pattern transferring process from a mask image to a resist image. As shown in FIG. 4, the forward propagation can include a symmetry group representative image module 402 for receiving input A0 and determining a symmetry group representative image m, a mask image module 404 for determining a mask image M, an aerial image module 406 for determining an aerial image AI, a resist image module 408 for determining a resist image RI, and a resist image intensity and slope module 410 for determining resist image intensity $RI_k$ and its gradient/slope $RI'_k$ at a polygon evaluation point k, respectively. The resist image RI can be, for example, a photoresist image or an etched wafer image.

The polygon evaluation point k can be, for example, a target polygon evaluation point for evaluation of RI and/or RI slope images. m, M, AI, RI, $RI_k$, $RI'_k$ can be represented as matrices (e.g., two-dimensional matrices).

In some implementations, symmetry requirements can be enforced at the mask image M to generate symmetric SRAFs. The EPE and side lobe penalty output s at an evaluation point on the resist image can be determined at EPE module 412 and side lobe penalty module 414, respectively. Side lobes can include, for example, extra contours on the wafer that does not match a design target. For example, the values of EPE and s can be approximately determined according to the following equations:

$$EPE_k = -\frac{(RI_k - \text{threshold})}{RI'_k} \quad \text{Equation (1)}$$

$$s_j = \frac{RI_j}{\text{threshold}} - (1 + a) \quad \text{Equation (2)}$$

where k is a polygon evaluation point, $EPE_k$ is EPE at the polygon evaluation point k, threshold is a predetermined model parameter, j is a side lobe penalty evaluation point, $s_j$ is side lobe penalty output (e.g., violations values of side lobe penalty) at the side lobe penalty evaluation point j, and a is a positive numerical value (e.g., around 0) to specify margin of sidelobe printing violations. In some implementations, threshold and a can be user input parameters.

To achieve desired wafer image according to the forward propagation process 400, the m can be adjusted as mentioned. To determine the optimum adjustments, a backward propagation of residual errors can be used in conjunction with the forward propagation process 400, as will be described below.

Figure 5:
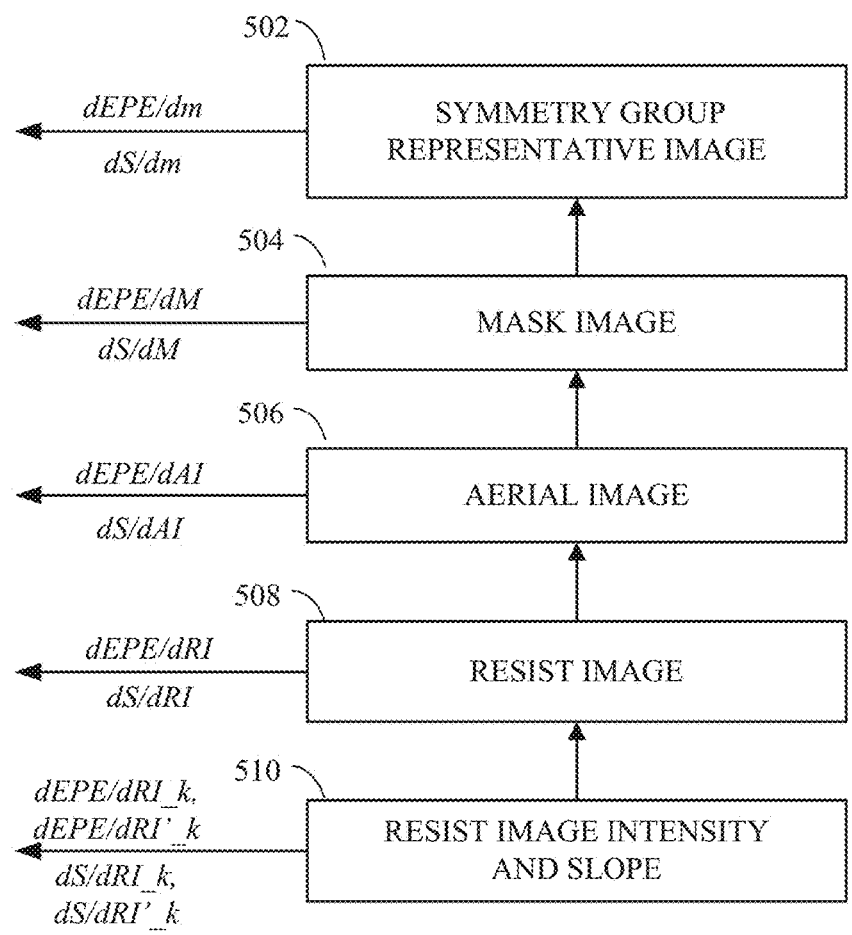
FIG. 5 is a diagram of an example process of backward propagation for edge based optimization that can be used in conjunction with the process of forward propagation shown in FIG. 4 in accordance with implementations of the present disclosure.

FIG. 5 is a diagram of an example process 500 of backward propagation from residual errors to optimization variables that can be used in conjunction with the forward propagation process 400 shown in FIG. 4. In some implementations, the process 500 can implement a sequential quadratic programming (SQP) technique, and use Jacobians of the EPEs as parameters. For example, the EPE (at an evaluation point k) with respect to resist image intensity (at the evaluation point k) can be determined using a partial derivative from Equation (1).

In a similar manner, the side lobe penalty with respect to resist image intensity, EPE and side lobe penalty with respect to resist image intensity gradient $$\left(\frac{\partial S_k}{\partial RI_k}, \frac{\partial EPE_k}{\partial RI'_k}, \frac{\partial S_k}{\partial RI'_k}\right)$$

can be determined at resist image intensity and slope module 510. The EPE and side lobe penalty with respect to resist image $$\left(\frac{\partial EPE_k}{\partial RI}, \frac{\partial S_k}{\partial RI}\right)$$

can be determined at resist image module 508. The EPE and side lobe penalty with respect to aerial image $$\left(\frac{\partial EPE_k}{\partial AI}, \frac{\partial S_k}{\partial AI}\right)$$

can be determined at aerial image module 506. The EPE and side lobe penalty with respect to mask image $$\left(\frac{\partial EPE_k}{\partial MI}, \frac{\partial S_k}{\partial MI}\right)$$

can be determined at mask image module 504. The EPE and side lobe penalty with respect to symmetry group representative image $$\left(\frac{\partial EPE_k}{\partial m}, \frac{\partial S_k}{\partial m}\right)$$

can be determined at symmetry group representative image module 502.

In some implementations, weighted process conditions can be implemented in the process 400 or 500 for the polygon global optimization. For example, for the global image based optimization, a cost function can be used. The cost function can be used to evaluate the quality of the solution to the optimization problem. For example, the cost function can be absolute values of the difference between the resist image and the target pattern. Various elements can be included in the cost function including, but not limited to, ILS of the image, EPE of the image, MEEF and its robustness, any combination or derivation of the above, or other factors that can be used to calculate cost. For example, a cost function of a process condition i can be represented as follows:

$$\text{cost} = \Sigma_i \text{weight}_i \cdot \text{cost}_i \quad \text{Equation (3)}$$

For the polygon global optimization, the cost function of each process condition for can be represented as follows:

$$\text{cost} = \text{cost1} + \text{cost2} \quad \text{Equation (4)}$$

$$\text{cost1} = \Sigma_k \text{ weight}_k \cdot EPE_k^N \quad \text{Equation (5)}$$

$$\text{cost2} = \begin{cases} s_j^p & (s_j > 0) \\ 0 & (s_j \leq 0) \end{cases} \quad \text{Equation (6)}$$

where k is a polygon evaluation point, $EPE_k$ is EPE at the polygon evaluation point k, N is an even integer number (e.g., 2, 4, or other even integer numbers) to specify cost1 as a sum of $N^{th}$ power of $EPE_k$, j is a side lobe penalty evaluation point, $s_j$ is side lobe penalty output at the side lobe penalty evaluation point j, and p is an even integer number (e.g., 2, 4, or other even integer numbers) to specify penalty cost function cost2 as a sum of $p^{th}$ power of $s_j$. In some implementations, N and p can be user input parameters (e.g., tuning parameters). Cost1 in Equation (5) can be used to minimize contour EPE. Cost2 in Equation (6) can be used to control the SRAF(s) of the aerial image to prevent printing side lobes onto the wafer. The BFGS technique described above in the process 400 in FIG. 4 can use gradients of the cost functions for the optimization, for example.

Examples of process conditions can include one or more of delta exposure dose, delta defocus, mask error, or a combination of the above. For example, the delta exposure dose can be applied to a threshold. The delta defocus can be used with a set of transmission cross coefficient (TCC) models. The mask error can be indicated as $$dM = \sqrt{\left(\frac{\partial M}{\partial x}\right)^2 + \left(\frac{\partial M}{\partial y}\right)^2} \cdot bias \qquad \text{Equation (7)}$$

wherein M is the mask image and bias is a model parameter to specify error in mask making process.

In some implementations, the hybrid polygon-image based co-optimization as mentioned in FIG. 2 can be formulated based on complete knowledge of modeling from mask polygon to resist image. For example, in the hybrid polygon-image based co-optimization technique, the cost function can be determined as Equation (5), and the edge placement error for an evaluation point k can be determined as a function of $$EPE_k = EPE_k(M_{SRAF}, EDGE_{main}) \qquad \text{Equation (8)}$$

wherein $M_{SRAF}$ are pixels in a SRAF region of the mask image, and $EDGE_{main}$ are edges of main features. As mentioned, the SRAF is one of the assist features that can be used in the mask optimization process. In Equation (8), $EDGE_{main}$ can be dithered (e.g., using a low pass filter) into a mask image $M_{main}$ that only includes the main features:

$$M_{main} = \text{LowPassFilter}(EDGE_{main}) \qquad \text{Equation (9)}$$

and a full mask image M can be determined as $$M = M_{main} + M_{SRAF} \qquad \text{Equation (10)}$$

In some implementations, the M can be transferred to an aerial image AI through an optical model. For example, the optical model can be an optical TCC model (e.g., a classical optical TCC model).

In some implementations, the gradient of the cost function (e.g., the cost as indicated in Equation (5)) with respect to variables can be determined as the following based on a chain rule:

$$\frac{\partial COST}{\partial M_{SRAF}} = \frac{\partial AI}{\partial M_{SRAF}} \times \frac{\partial COST}{\partial AI} \qquad \text{Equation (11)}$$

$$\frac{\partial COST}{\partial EDGE_{main}} = \frac{\partial LowPassFilter}{\partial EDGE_{main}} \times \frac{\partial AI}{\partial M_{main}} \times \frac{\partial COST}{\partial AI} \qquad \text{Equation (12)}$$

To improve performances of the optimization processes, in some implementations, the $M_{SRAF}$ and the $EDGE_{main}$ can be scaled. For example, the $M_{SRAF}$ and the $EDGE_{main}$ can be separately scaled to the same numerical level.

In some implementations, when optimizing the M and polygon edges of the main features, the BFGS technique (e.g., a BFGS solver) as described in the process 400 in FIG. 4 can be used. In an implementation, in addition to the BFGS technique, a Jacobian based technique (e.g., a Jacobian based solver) can also be used for the optimization. For example, the Jacobian based technique can use quadratic programming technique (e.g., the SQP technique). In an implementation, for example, the Jacobian based solver can take Jacobians $$\frac{\partial EPE}{\partial M} \text{ and } \frac{\partial EPE}{\partial EDGE}$$

as inputs. By using the Jacobian based technique, the connection between EPE and at least one of M and polygon edges can be exposed to the Jacobian based solver, which can help to improve optimization of local EPE.

Figure 6:
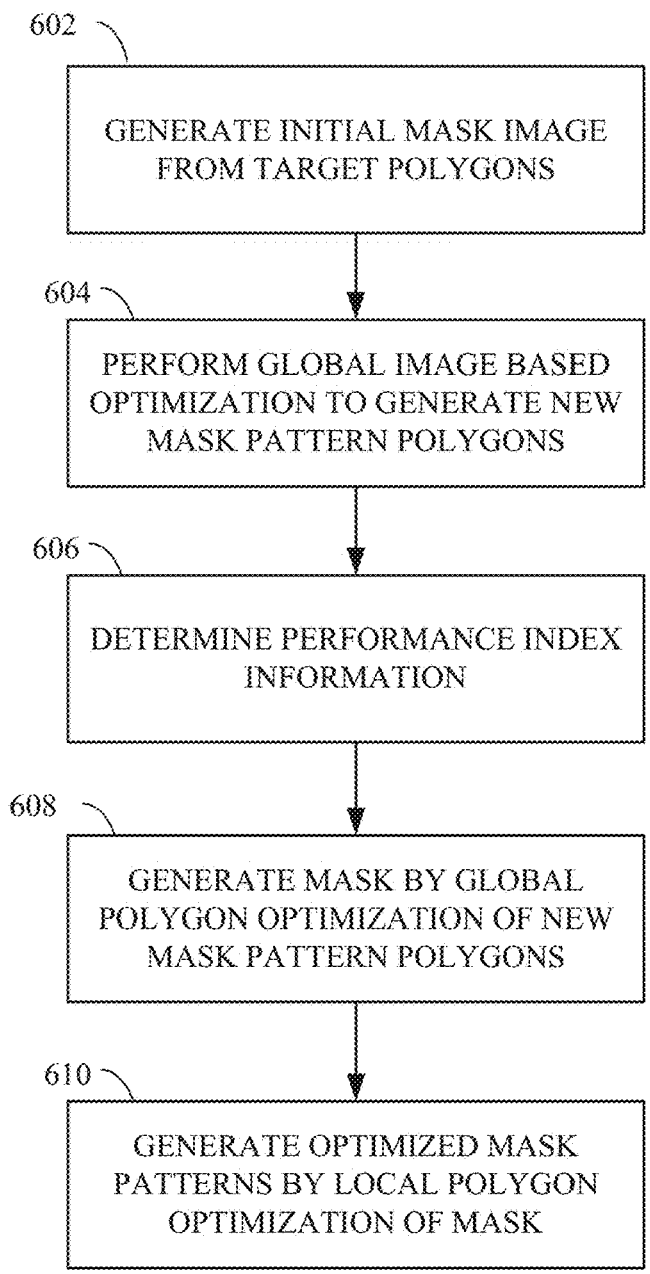
FIG. 6 is a flow diagram of an example process of mask pattern generation in accordance with implementations of the present disclosure.

FIG. 6 is a flow chart block diagram of an example process 600 of mask pattern generation. Process 600 depicted in FIG. 6 may be performed by software modules (e.g., instructions or code) executed by a processor of a computer system, by hardware modules of the computer system, or combinations thereof. The computer system can include, for example, one or more computing devices. For example, the computer system can include the computer device 100 in FIG. 1. One or more operations described herein can be incorporated into, for example, full chip mask optimization, or next generation OPC products.

The software modules can include machine-readable instructions that can be stored in a memory such as memory 125 shown in FIG. 1. The machine-readable instructions can be executed by one or more processors, such as CPU 122, GPU 123, and/or the microcontroller 121 that includes one or more CPUs and one or more GPUs, to cause the computing device to perform process 600. The one or more computing devices can be implemented as an apparatus included in the mask layout generation system, as discussed in FIGS. 2-5. Process 600 can be implemented using specialized hardware or firmware. Some computing devices can have multiple memories, multiple processors, or both. For example, the operations of process 600 can be distributed using different processors (such as CPU 122 and GPU 123 in FIG. 1). Use of the terms "processor" or "memory" in the singular encompasses computing devices that have one processor or one memory as well as devices that have multiple processors or multiple memories that can each be used in the performance of some or all of the recited operations. For simplicity of explanation, process 600 is depicted and described as a series of operations. However, operations in accordance with this disclosure can occur in various orders and/or concurrently. Additionally, operations in accordance with this disclosure may occur with other operations not presented and described herein. Furthermore, not all illustrated operations may be required to implement a method in accordance with the disclosed subject matter.

At operation 602, an initial mask image can be generated from target polygons. In an implementation, the SRAF image and main feature polygon hybrid co-optimization module 206 in FIG. 2 can generate an initial mask image of an oversized target design. In some implementations, the initial mask image can be generated by a processor that includes at least one CPU and at least one GPU.

At operation 604, new mask pattern polygons can be generated by global image based full IC optimization of the initial mask image. For example, the global image based full IC optimization can be based on an inverse lithographic technology (ILT) technique. In an implementation, the SRAF image and main feature polygon hybrid co-optimization module 206 can perform an ILT process on the initial mask image generated in the operation 602 and produce a grayscale mask image including the new mask pattern polygons. For example, the global image based full IC optimization can include a dissectionless based optimization. For example, the new mask pattern polygons can include dissected main polygons and dissected SRAF polygons. For another example, the new mask pattern polygons can be dissected to generate the main polygons and the SRAF polygons.

At operation 606, performance index information based on the global image based full IC optimization can be determined. The performance index information can include data for assisting a global polygon optimization. For example, the performance index information can include parameters for hotspots identified during the global image based full chip optimization. The parameters can include an edge placement error, a process window metric, a mask error enhancement factor, an image log slope value, or any combination of the above. In an implementation, the SRAF image and main feature polygon hybrid co-optimization module 206 can determine the performance index information. In another implementation, the determined performance index information can be stored in a database, such as, for example, the hotspot library 210 in FIG. 2.

At operation 608, a mask can be generated by the global polygon optimization of the new mask pattern polygons. In some implementations, the global polygon optimization can include at least one iteration of itself, each iteration including a forward propagation and a backward propagation. In some implementations, the global polygon optimization can include process conditions and a cost function for each process condition. For example, the process conditions can include edge placement error and side lobe penalty. The cost function for the edge placement error can be used to minimize polygon contour edge placement error, and the cost function for the side lobe penalty can be used to prevent side lobe printing. In an implementation, the polygon global optimization module 212 in FIG. 2 can perform edge based optimization, such as an optical proximity correction (OPC) analysis, to generate an optimized mask from a grayscale mask generated at the operation 604. In an implementation, the edge based optimization can include a forward propagation and a backward propagation using cost functions related to edge placement error and side lobe penalty. In some implementations, the forward propagation and the backward propagation provide updated variables for the global polygon optimization. In an implementation, the forward propagation of the global polygon optimization can determine a symmetry group representative image for enforcing a symmetrical placement of SRAF polygons in the grayscale mask as mentioned.

In some implementations, the forward propagation of the global polygon optimization can include operations of: determining a mask image, determining an aerial image, determining a resist image, determining a resist image intensity and a resist image intensity slope, and determining an edge placement error cost and a side lobe penalty cost.

In some implementations, the forward propagation of the global polygon optimization can include operations of: receiving an edge placement error cost and a side lobe penalty cost from the forward propagation, determining a cost gradient for edge propagation error and side lobe penalty for at least one pixel on a new mask image, and determining a variable update for the global polygon optimization based on the cost gradient.

At operation 610, optimized mask patterns can be generated by a local polygon optimization of the mask generated at the operation 608. In an implementation, the polygon local optimization module 216 in FIG. 2 can perform edge based optimization of polygon contour pixels using the performance index information stored in the hotspot library 210 to generate a final mask pattern. In some implementations, symmetry requirements can be enforced on the final mask pattern to make the SRAFs symmetric, similar to the symmetry requirements applied to the grayscale mask as mentioned. In some implementations, the global polygon optimization and localized polygon optimization can include optical proximity correction (OPC) using process conditions on fully dissected new mask pattern polygons. In an implementation, the global polygon optimization and localized polygon optimization can dissect the new mask pattern polygons using a model based dissection technique.

Figure 7:
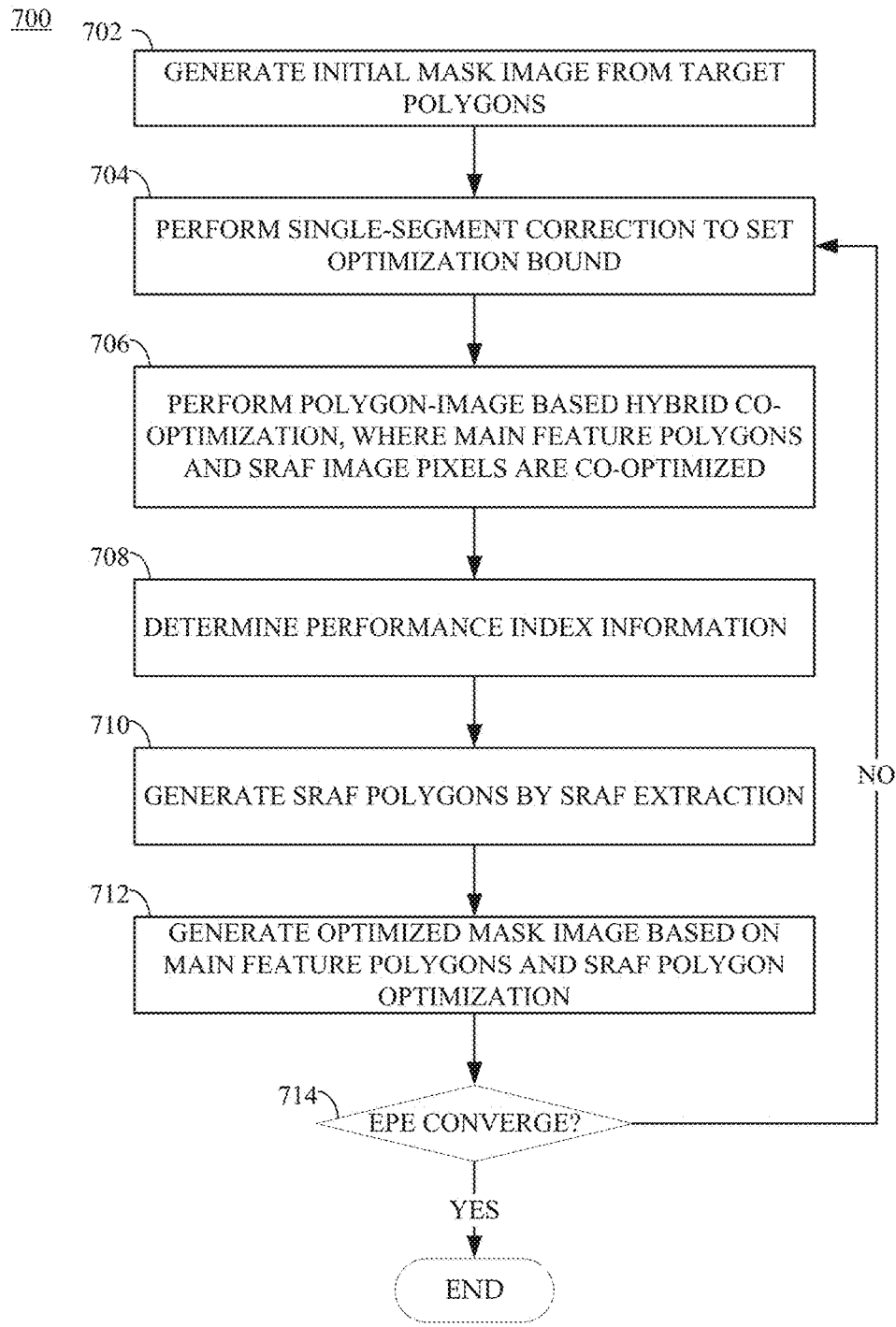
FIG. 7 is a flow diagram of an example process of mask pattern generation using hybrid polygon-image based co-optimization technique in accordance with implementations of the present disclosure.

FIG. 7 is a flow chart block diagram of an example process 700 of mask pattern generation using the hybrid polygon-image based co-optimization technique. Process 700 depicted in FIG. 7 can be performed by software modules (e.g., instructions or code) executed by a processor of a computer system, by hardware modules of the computer system, or combinations thereof. The computer system can include, for example, one or more computing devices. For example, the computer system can include the computer device 100 in FIG. 1. One or more operations described herein can be incorporated into, for example, full chip mask optimization, or next generation OPC products.

The software modules can include machine-readable instructions that can be stored in a memory such as memory 125 shown in FIG. 1. The machine-readable instructions can be executed by one or more processors, such as CPU 122, GPU 123, and/or the microcontroller 121 that includes one or more CPUs and one or more GPUs, to cause the computing device to perform process 700. The one or more computing devices can be implemented as an apparatus included in the mask layout generation system, as discussed in FIGS. 2-6. Process 700 can be implemented using specialized hardware or firmware. Some computing devices can have multiple memories, multiple processors, or both. For example, the operations of process 700 can be distributed using different processors (such as CPU 122 and GPU 123 in FIG. 1). Use of the terms "processor" or "memory" in the singular encompasses computing devices that have one processor or one memory as well as devices that have multiple processors or multiple memories that can each be used in the performance of some or all of the recited operations. For simplicity of explanation, process 700 is depicted and described as a series of operations. However, operations in accordance with this disclosure can occur in various orders and/or concurrently. Additionally, operations in accordance with this disclosure may occur with other operations not presented and described herein. Furthermore, not all illustrated operations may be required to implement a method in accordance with the disclosed subject matter.

At operation 702, an initial mask image can be generated from target polygons. In an implementation, the SRAF image and main feature polygon hybrid co-optimization module 206 in FIG. 2 can identify mask patterns from an image of an initial target design and generate the initial mask image from the target polygons. In some implementations, the mask patterns can be identified by a processor that includes at least one CPU and at least one GPU. The operation 702 can be similar to the operation 602 in the process 600 in FIG. 6.

At operation 704, single-segment (e.g., single-edge) correction is performed on the mask patterns. The results of the single-segment correction can be used to set bounds of optimization. For example, the single-segment correction can update the segment (e.g., edges) placement based on EPE. In some implementations, the single-segment correction can be a loop operation that terminates when termination conditions are met. In an implementation, the single-edge correction can be performed by the single-segment correction module 204 in FIG. 2.

At operation 706, hybrid polygon-image based co-optimization is performed. At this operation, the segments of the main feature polygons and SRAF image pixels (e.g., image pixels in the SRAF region) of the initial mask image are co-optimized. In an implementation, the main feature polygons and SRAF image pixels can be associated with the initial mask image and/or the target polygons. In an implementation, the SRAF image and main feature polygon hybrid co-optimization module 206 can perform the hybrid polygon-image based co-optimization on the mask patterns identified in the operation 702 and corrected in the operation 704. For example, the hybrid polygon-image based co-optimization can use the BFGS technique and/or the Jacobian based technique as described in FIG. 5.

At operation 708, performance index information based on the hybrid polygon-image based co-optimization can be determined. The performance index information can include data for assisting the hybrid polygon-image based co-optimization and/or global polygon optimization. In an implementation, the SRAF image and main feature polygon hybrid co-optimization module 206 can determine the performance index information. In another implementation, the determined performance index information can be stored in a database, such as, for example, the hotspot library 210 in FIG. 2. The operation 708 can be similar to the operation 606 in the process 600 in FIG. 6.

At operation 710, SRAF polygons are generated by SRAF extraction. For example, the SRAF polygons can be extracted from the SRAF image pixels. In an implementation, the SRAF extraction can be performed when an SRAF signal emerge from the SRAF image pixels. In an implementation, when the SRAF extraction is performed, SRAF image pixels (e.g., the $MI_{SRAF}$) can be replaced by SRAF edges as variables for optimization. In some implementations, SRAF image pixels can be optimized to conform to a shape of a target polygon to generate SRAF signals with higher physical correctness. For example, for SRAF image pixels near tile boundaries, constraints can be imposed on the SRAF image pixels according to a the shape of the target polygon. In an implementation, the SRAF extraction can be performed by the polygon global optimization module 212 in FIG. 2 using the performance index information stored in the hotspot library 210.

At operation 712, an optimized mask image is generated based on the main feature polygons and SRAF polygon optimization. The main feature polygons can be co-optimized in the operation 704. In an implementation, the SRAF polygon optimization can be performed by the polygon local optimization module 216 in FIG. 2 using the performance index information stored in the hotspot library 210.

At operation 714, it is determined whether EPE of the generated optimized mask converges. If the EPE does not converge, the process 700 can go back to the operation 704. If the EPE converges, the process 700 can terminate and the final optimized mask patterns can be generated. In an implementation, the operation 714 can be performed by the optimization requirement determination module 218 in FIG. 2.

In the processes 600 and 700, a rule-based method and a model-based method can be used for optimizations, including but not limited to, polygon region identification, dissection setting, symmetry and boundary handlings, correction optimization, and constrain management. The rule-based method is faster and more controllable by a user, and the model-based method is more automatic. The optimizations can be performed seamlessly on the same software platform with user controllable performance index information and constraints. Intermediate optimization results can be used to improve accuracy, flexibility, and runtime. User configurable staged GPU can be used for acceleration of the optimization.

The implementations herein can be described in terms of functional block components and various processing steps. The disclosed processes and sequences can be performed alone or in any combination. Functional blocks can be realized by any number of hardware and/or software components that perform the specified functions. For example, the described implementations can employ various integrated circuit components, e.g., memory elements, processing elements, logic elements, look-up tables, and the like, which can carry out a variety of functions under the control of one or more microprocessors or other control devices. Similarly, where the elements of the described implementations are implemented using software programming or software elements the disclosure can be implemented with any programming or scripting language such as C, C++, Java, assembler, or the like, with the various algorithms being implemented with any combination of data structures, objects, processes, routines or other programming elements. Functional implementations can be implemented in algorithms that execute on one or more processors. Furthermore, the implementations of the disclosure could employ any number of conventional techniques for electronics configuration, signal processing and/or control, data processing and the like.

Implementations or portions of implementations of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device. Other suitable mediums are also available. Such computer-usable or computer-readable media can be referred to as non-transitory memory or media, and can include RAM or other volatile memory or storage devices that can change over time. A memory of an apparatus described herein, unless otherwise specified, does not have to be physically contained by the apparatus, but is one that can be accessed remotely by the apparatus, and does not have to be contiguous with other memory that might be physically contained by the apparatus.

The word "example" is used herein to mean serving as an example, instance, or illustration. Any implementation or design described herein as "example" is not necessarily to be construed as preferred or advantageous over other implementations or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same implementation or implementation unless described as such.

The particular implementations shown and described herein are illustrative examples of the disclosure and are not intended to otherwise limit the scope of the disclosure in any way. For the sake of brevity, conventional electronics, control systems, software development and other functional implementations of the systems (and components of the individual operating components of the systems) can not be described in detail. Furthermore, the connecting lines, or connectors shown in the various figures presented are intended to represent exemplary functional relationships and/or physical or logical couplings between the various elements. Many alternative or additional functional relationships, physical connections or logical connections can be present in a practical device.

The use of "including" or "having" and variations thereof herein is meant to encompass the items listed thereafter and equivalents thereof as well as additional items. Unless specified or limited otherwise, the terms "mounted," "connected," 'supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

The above-described implementations have been described in order to allow easy understanding of the present disclosure and do not limit the present disclosure. To the contrary, the disclosure is intended to cover various modifications and equivalent arrangements included within the scope of the appended claims, which scope is to be accorded the broadest interpretation so as to encompass all such modifications and equivalent structure as is permitted under the law.

What is claimed is:

1. A method for full integrated circuit (IC) mask pattern generation, comprising:
    generating, by a processor, an initial mask image from target polygons, wherein main feature polygons and SRAF image pixels are identified in the initial mask image;
    performing, by the processor using iterative optimization based on an inverse lithographic technology (ILT), a co-optimization on segments of main feature polygons and subresolution assist feature (SRAF) image pixels;
    after iterations of the co-optimization, determining SRAF polygons from the SRAF image pixels;
    determining optimized mask patterns by performing an edge based optimization on the segments of the main feature polygons and the SRAF polygons using gradient-based iterative optimization; and
    generating a full-IC mask based on the optimized mask patterns.

2. The method of claim 1, wherein the edge based optimization comprises at least one iteration of a forward propagation and at least one iteration of a backward propagation.

3. The method of claim 2, wherein the edge based optimization comprises process conditions and a cost function for each process condition, wherein the process conditions comprise an edge placement error and a side lobe penalty value.

4. The method of claim 3, wherein the cost function for the side lobe penalty value prevents side lobe printing in the optimized mask patterns.

5. The method of claim 2, wherein the gradient-based iterative optimization comprises at least one of a Broyden-Fletcher-Goldfarb-Shanno (BFGS) technique, a Gauss-Newton technique, a sequential quadratic programming (SQP), and a Jacobian based technique.

6. The method of claim 3, wherein determining the optimized mask patterns by performing the edge based optimization comprises:
    scaling the main feature polygons and the SRAF image pixels to the same numeric level;
    determining a full mask image by aggregating the SRAF image pixels and a mask image dithered from the main feature polygons using a low pass filter; and
    determining the cost function based on an aerial image transferred from the full mask image.

7. The method of claim 1, wherein performing the co-optimization on the segments of the main feature polygons and the SRAF image pixels comprises:
    optimizing SRAF image pixels near a boundary of a tile of the initial mask image in accordance with a shape of one of the target polygons.

8. The method of claim 1, further comprising:
    determining whether the optimized mask patterns meet an optimization requirement;
    based on a determination that the optimized mask patterns meet the optimization requirement, storing the optimized mask patterns as final mask data; and
    based on a determination that the optimized mask patterns do not meet the optimization requirement, updating a segment placement of the optimized mask patterns based on an edge placement error (EPE) of the optimized mask patterns.

9. The method of claim 8, further comprising:
    after updating the segment placement of the optimized mask patterns, setting a bound for at least one of the co-optimization and the edge based optimization.

10. The method of claim 8, wherein the optimization requirement comprises that the EPE of the optimized mask patterns converges.

11. The method of claim 8, further comprising:
    enforcing symmetrical placement of the SRAF polygons in the final mask data.

12. The method of claim 1, wherein the gradient-based iterative optimization comprises an optical proximity correction (OPC) technique.

13. The method of claim 12, wherein the OPC technique comprises a first OPC process for global polygon optimization and a second OPC process for local polygon optimization, and wherein binary main polygons and binary SRAF polygons are generated in the first OPC process, and error checks along a contour of a polygon of the main feature polygons and the SRAF polygons are performed in the second OPC process.

14. The method of claim 1, further comprising:
determining, based on the co-optimization, performance index information for assisting at least one of the co-optimization and the edge based optimization, wherein the performance index information comprises parameters for hotspots identified during the co-optimization, and wherein the parameters comprise at least one of an edge placement error, a process window metric, a mask error enhancement factor (MEEF), and an image log slope (ILS) value.

15. The method of claim 1, wherein the processor comprises a central processing unit (CPU) and a graphics processing unit (GPU).

16. An apparatus for full chip mask pattern generation, comprising:
a memory; and
a processor configured to execute instructions stored in the memory to:
generate an initial mask image from target polygons, wherein main feature polygons and SRAF image pixels are identified in the initial mask image;
perform, using iterative optimization based on an inverse lithographic technology (ILT) technique, a co-optimization on segments of main feature polygons and subresolution assist feature (SRAF) image pixels;
after iterations of the co-optimization, determine SRAF polygons from the SRAF image pixels;
determine optimized mask patterns by performing an edge based optimization on the segments of the main feature polygons and the SRAF polygons using an optical proximity correction (OPC) technique;
generate a full-IC mask based on the optimized mask patterns.

17. The apparatus of claim 16, wherein the processor is further configured to execute instructions to:
determine whether an edge placement error (EPE) of the optimized mask patterns converges;
based on a determination that the EPE of the optimized mask patterns converges, store the optimized mask patterns as final mask data; and
based on a determination that the EPE of the optimized mask patterns does not converge, update a segment placement of the optimized mask patterns based on the EPE.

18. The apparatus of claim 17, wherein the processor is further configured to execute instructions to:
after updating the segment placement of the optimized mask patterns, set a bound for at least one of the co-optimization and the edge based optimization.

19. A non-transitory computer readable medium for full chip mask pattern generation, having stored thereon executable instructions for causing a processor to perform the executable instructions to:
perform, using iterative optimization based on an inverse lithographic technology (ILT) technique, a co-optimization on segments of main feature polygons and subresolution assist feature (SRAF) image pixels, wherein the main feature polygons and the SRAF image pixels are identified in an initial mask image generated from target polygons;
after iterations of the co-optimization, determine SRAF polygons from the SRAF image pixels;
determine optimized mask patterns by performing an edge based optimization on the segments of the main feature polygons and the SRAF polygons using an optical proximity correction (OPC) technique;
enforce symmetrical placement of the SRAF polygons in the optimized mask patterns; and
generate a full-IC mask based on the optimized mask patterns.

20. The non-transitory computer readable medium of claim 19, further comprising instructions which when executed by the processor become operational with the processor to:
determine whether an edge placement error (EPE) of the optimized mask patterns converges;
based on a determination that the EPE of the optimized mask patterns converges, store the optimized mask patterns as final mask data; and
based on a determination that the EPE of the optimized mask patterns does not converge, update a segment placement of the optimized mask patterns based on the EPE.

* * * * *